United States Patent
Kim

(10) Patent No.: US 8,677,614 B2
(45) Date of Patent: Mar. 25, 2014

(54) DEVICE MOUNTING METHOD DETERMINING TOUCHING BETWEEN DEVICE AND BOARD

(75) Inventor: Bong-Joon Kim, Changwon-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 0 days.

(21) Appl. No.: 13/299,016

(22) Filed: Nov. 17, 2011

(65) Prior Publication Data

US 2012/0117796 A1 May 17, 2012

(30) Foreign Application Priority Data

Nov. 17, 2010 (KR) .......................... 10-2010-0114517

(51) Int. Cl.
*H05K 3/30* (2006.01)

(52) U.S. Cl.
USPC ................... 29/832; 29/833; 29/740; 29/741; 29/721

(58) Field of Classification Search
USPC .......... 29/832–834, 740–743; 228/110.1, 1.1; 700/121
See application file for complete search history.

(56) References Cited

U.S. PATENT DOCUMENTS

| 5,431,324 | A | * | 7/1995 | Kajiwara et al. | 228/102 |
| 6,246,789 | B1 | * | 6/2001 | Hosotani et al. | 382/151 |
| 6,718,630 | B2 | * | 4/2004 | Hada et al. | 29/832 |
| 7,533,459 | B2 | * | 5/2009 | Kano et al. | 29/832 |
| 2003/0057552 | A1 | * | 3/2003 | Kainuma et al. | 257/737 |
| 2010/0065613 | A1 | * | 3/2010 | Nasu et al. | 228/110.1 |
| 2012/0117796 | A1 | * | 5/2012 | Kim | 29/832 |

FOREIGN PATENT DOCUMENTS

| KR | 10-0235459 B1 | 9/1999 |
| KR | 10-0275374 B1 | 12/2000 |
| KR | 10-0626177 B1 | 9/2006 |
| KR | 10-0649502 B1 | 11/2006 |
| KR | 10-0715725 B1 | 5/2007 |
| KR | 10-2007-0098280 A | 10/2007 |
| KR | 10-2009-0046612 A | 5/2009 |

* cited by examiner

*Primary Examiner* — Minh Trinh
(74) *Attorney, Agent, or Firm* — Sughrue Mion, PLLC

(57) ABSTRACT

Provided are a chip mounting method and device. The chip mounting device comprises: a bonding head on which a device is loaded; and a controller which places the bonding head at a preparation height above a board, determines a search height at which a mounting position on the board, on which the device is to be mounted, is searched for by the controller, and lowers the bonding head from the preparation height to a bonding height via the search height and mounts the device on the mounting position on the board, by controlling movements of the bonding head, wherein the controller determines that the device touches the board if at least one of a plurality of conditions is satisfied.

10 Claims, 7 Drawing Sheets

DEVICE MOUNTING METHOD DETERMINING TOUCHING BETWEEN DEVICE AND BOARD

CROSS-REFERENCE TO RELATED PATENT APPLICATION

This application claims priority from Korean Patent Application No. 10-2010-0114517 filed on Nov. 17, 2010 in the Korean Intellectual Property Office, the disclosure of which is incorporated herein by reference in its entirety.

BACKGROUND

1. Field

Apparatuses and methods consistent with exemplary embodiments relate to mounting device on a board, and more particularly to, mounting a flip chip on a circuit board based on height control.

2. Description of the Related Art

Flip chip is a method of mounting a semiconductor chip on a circuit board without using wires. Mounting methods for accurately finding a mounting position on a circuit board on which a semiconductor chip is to be mounted have been devised.

A spindle in a flip chip mounting device repeatedly moves up and down to pick-up, dip, inspect, and mount a part on a printed circuit board (PCB). In this process, if the mounting position on a circuit board on which a semiconductor chip is to be mounted cannot be found accurately, the spindle may be in a different state from its initial assembled state due to various reasons including wear and tear of tools, loosening of bolts, and the life of a motor. Therefore, it is very important to accurately find the mounting position on the circuit board on which the semiconductor chip is to be mounted.

SUMMARY

One or more exemplary embodiments provide a device mounting method for accurately locating a mounting position on a board.

One or more exemplary embodiments also provide a device mounting apparatus for accurately locating the mounting position on the board.

One or more exemplary embodiments also provide a chip mounting apparatus for preventing deformation of tools by accurately locating the mounting position on the board.

According to an aspect of an exemplary embodiment, there is provided a device mounting method including: placing a bonding head, on which a device is loaded, at a preparation height above a board; determining a search height at which a mounting position on the board, on which the device is to be mounted, is searched for; and lowering the bonding head from the preparation height to a bonding height via the search height, and mounting the device on the mounting position on the board, wherein the lowering and mounting comprises determining whether the device touches the board by performing at least one of:
(a) obtaining a command height of the bonding head input by a controller of the bonding head and an actual height of the bonding head at two successive time points, obtaining a difference between the command height and the actual height at the two successive time points, and determining whether a first condition is satisfied, the first condition being that the difference at a later time point is greater than the difference at an earlier time point; (b) obtaining an actual velocity of the bonding head, comparing the actual velocity with a first reference value, and determining whether a second condition is satisfied, the second condition being that the actual velocity is lower than the first reference value; and (c) obtaining the actual height of the bonding head, comparing the actual height with a predetermined range of heights of the bonding head, and determining whether a third condition is satisfied, the third condition being that the actual height is within the predetermined range, and wherein it is determined that the device touches the board if at least one of the first, second and third conditions is satisfied.

According to an aspect of another exemplary embodiment, there is provided a device mounting apparatus comprising: a bonding head on which a device is loaded; and a controller which places the bonding head at a preparation height above a board, determines a search height at which a mounting position on the board, on which the device is to be mounted, is searched for, and lowers the bonding head from the preparation height to a bonding height via the search height and mounts the device on the mounting position on the board, by controlling movements of the bonding head, wherein, in lowering the bonding head and mounting the device on the mounting position, the controller determines whether the device touches the board by performing at least one of: (a) obtaining a command height of the bonding head input by the controller and an actual height of the bonding head at two successive time points, obtaining a difference between the command height and the actual height at the two successive time points, and determining whether a first condition is satisfied, the first condition being that the difference at a later time point is greater than the difference at an earlier time point; (b) obtaining an actual velocity of the bonding head, comparing the actual velocity with a first reference value, and determining whether a second condition is satisfied, the second condition being that the actual velocity is lower than the first reference value; and (c) obtaining the actual height of the bonding head, comparing the actual height with a predetermined range of heights of the bonding head, and determining whether a third condition is satisfied, the third condition being that the actual height is within the predetermined range, and wherein the controller determines that the device touches the board if at least one of the first, second and third conditions is satisfied.

According to an aspect of another exemplary embodiment, the device mounted on the mounting position of the board may be a semiconductor chip and the board may be a circuit board. The controller may control the bonding head to be lowered from the preparation height to the bonding height in a motion in combination of acceleration and deceleration.

BRIEF DESCRIPTION OF DRAWINGS

The above and other aspects will become more apparent by describing in detail exemplary embodiments with reference to the attached drawings, in which.

DETAILED DESCRIPTION OF EXEMPLARY EMBODIMENTS

Figure 1:
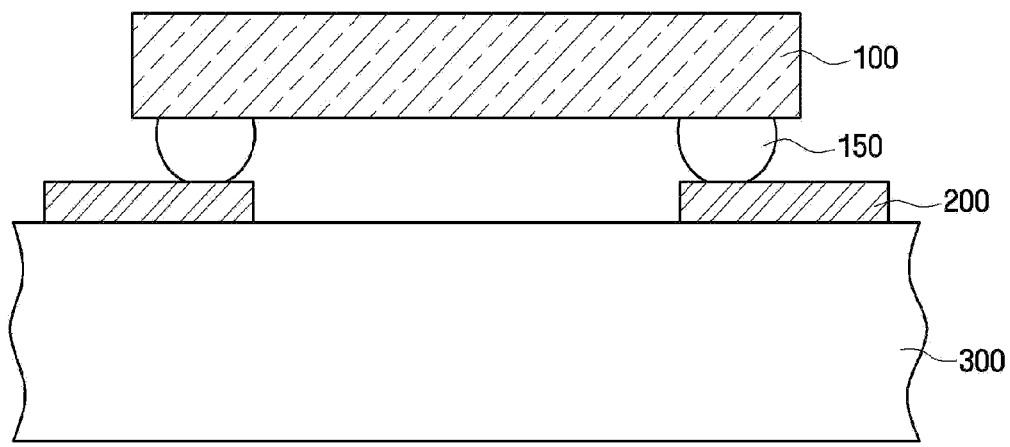
FIG. 1 is a cross-sectional view of a flip chip package realized by flip chip bonding.

The inventive concept will now be described more fully hereinafter with reference to the accompanying drawings, in which exemplary embodiments are shown. This inventive concept may, however, be embodied in different forms and should not be construed as limited to the exemplary embodiments set forth herein. Rather, these exemplary embodiments are provided so that this disclosure will be thorough and complete, and will fully convey the scope of the inventive concept to those skilled in the art. The same reference numbers indicate the same components throughout the specification.

It will also be understood that when a layer is referred to as being "on" another layer or substrate, it can be directly on the other layer or substrate, or intervening layers may also be present. In contrast, when an element is referred to as being "directly on" another element, there are no intervening elements present. The same reference numbers indicate the same components throughout the specification.

It will be understood that, although the terms first, second, etc. may be used herein to describe various elements, these elements should not be limited by these terms. These terms may only be used to distinguish one element from another element. Thus, for example, a first element, a first component or a first section discussed below could be termed a second element, a second component or a second section without departing from the teachings of the present invention.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, but do not preclude the presence or addition of one or more other components.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of an apparatus in use or operation in addition to the orientation depicted in the figures. For example, if the apparatus in the figures is turned over, elements described as "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein interpreted accordingly.

FIG. 1 is a cross-sectional view of a flip chip package realized by flip chip bonding. Referring to FIG. 1, a flip chip is also called a leadless semiconductor. It is a method of attaching a semiconductor chip 100 to a circuit board 300, not using an additional connection structure such as metal leads (wires) or a medium such as a ball grid array but using electrode patterns formed on a bottom surface of the semiconductor chip 100.

Flip chip bonding technology enables bonding the semiconductor chip 100 to the circuit board 300 using bumps 150. The bumps 150 are formed on the semiconductor chip 100, and patterns or pads 200 are formed on the circuit board 300. The semiconductor chip 100 is flipped over so that the bumps 150 face down and is mounted accordingly on the circuit board 300. The bumps 150 may be solder bumps or gold bumps.

A bonding process for coupling the semiconductor chip 100 and the circuit board 300 may use a thermo-compression bonding technique, an ultrasonic bonding technique, or a thermo-ultrasonic bonding technique. The bonding process is a process of bringing the semiconductor chip 100 and the circuit board 300 into contact with each other and applying a predetermined force as well as heat or ultrasonic waves to them. It is an important process that determines bonding quality.

Figure 2:
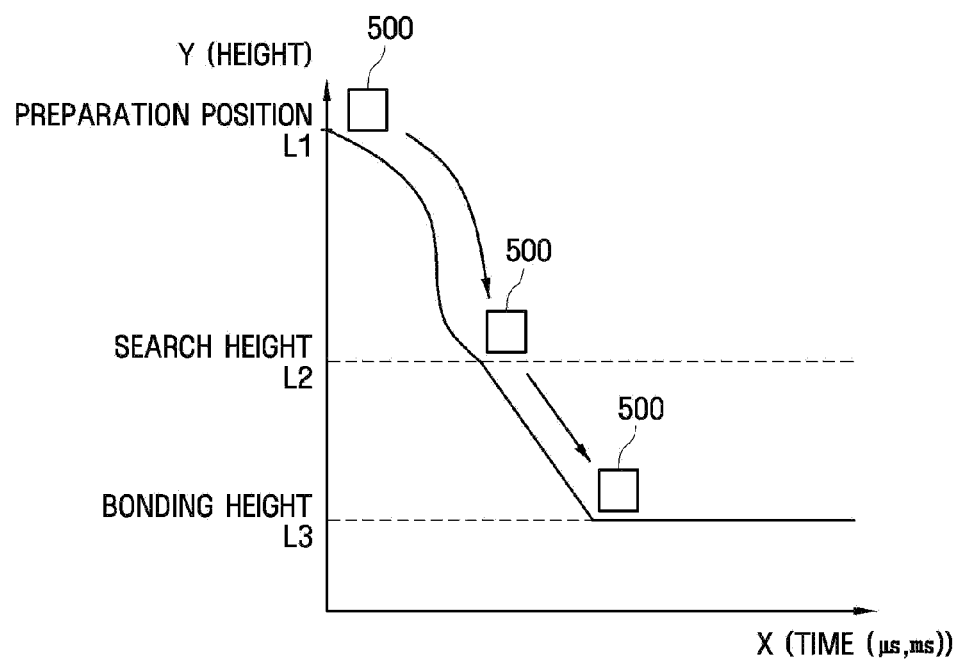
FIG. 2 is a graph illustrating height control of a bonding head 500 of a flip chip bonding apparatus to be described in detail in reference to FIGS. 7A and 7B, according to an exemplary embodiment.
Figure 7A:
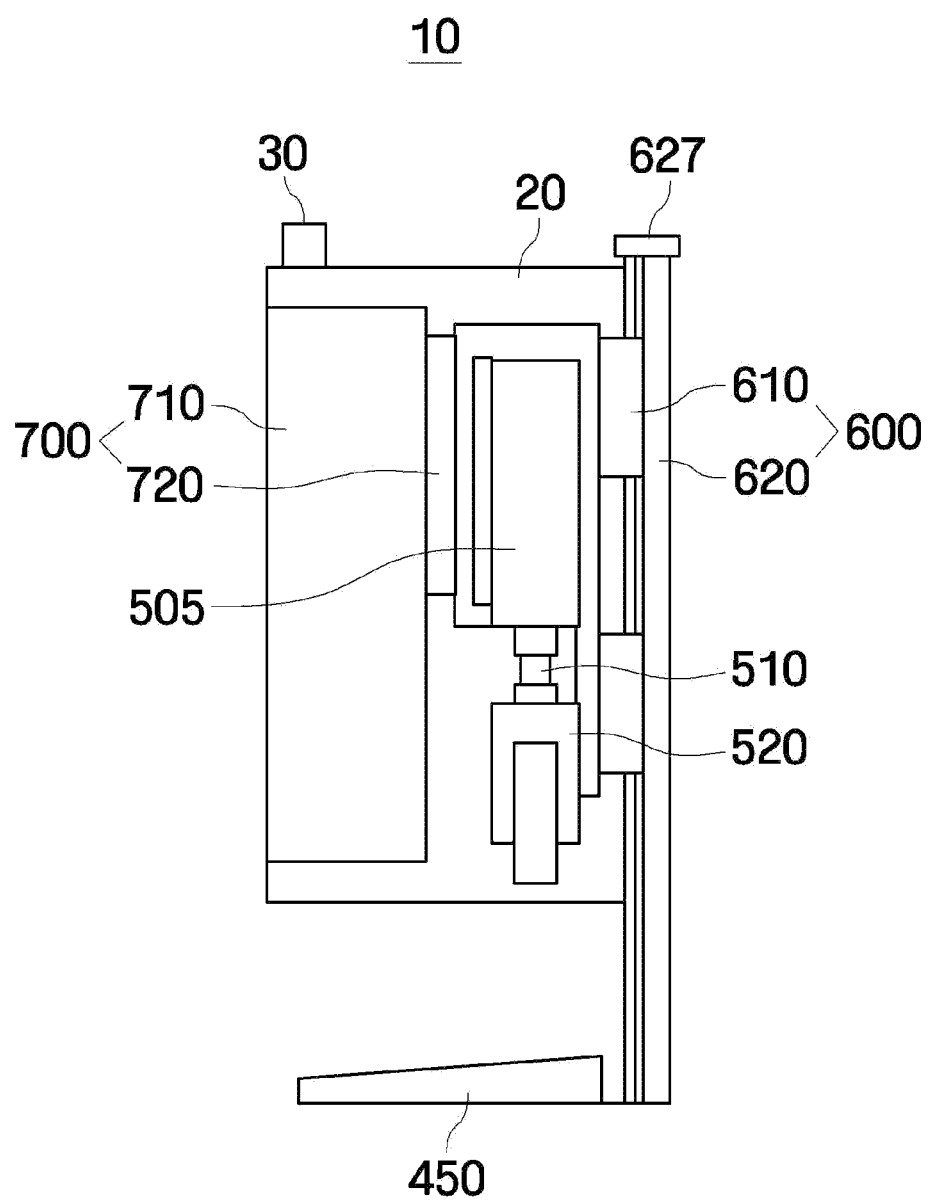
FIG. 7A illustrates a lateral cross-sectional view of a flip chip mounting apparatus 10 in reference to FIGS. 1 and 3, according to an exemplary embodiment.
Figure 7B:
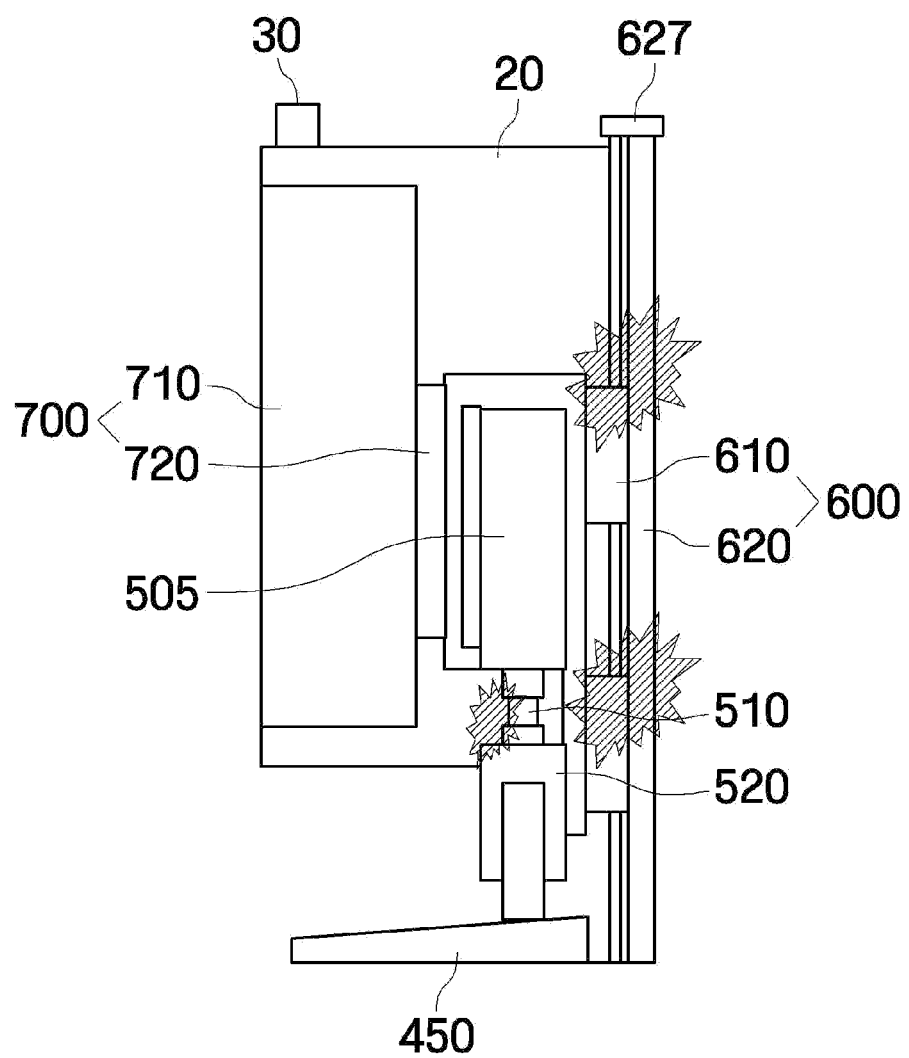
FIG. 7B illustrates a case where an up-and-down movement of at least one spindle 505 performing operations applies an impact to the spindle 505 and a linear guide, in reference to FIG. 7A, according to an exemplary embodiment.

FIG. 2 is a graph illustrating height control of a bonding head 500 of a flip chip bonding apparatus to be described in detail in reference to FIGS. 7A and 7B, according to an exemplary embodiment. Referring to FIG. 2, it is assumed that a virtual axis perpendicularly passing through the circuit board 300 is the Y-axis. The X-axis of the graph represents time measured in a unit of μs or ms. The Y-axis represents variance of a height of the bonding head 500 from a reference height from when the semiconductor chip 100 loaded on the bonding head 500 is prepared, lowered and mounted on the mounting position of the circuit board 300. The Y-axis includes a preparation height L1 which is above the circuit board 300 and to which the bonding head 500 loaded with the semiconductor chip 100 transfers the semiconductor chip 100, a search height L2 at which the bonding head 500 starts to search for a mounting position on the circuit board 300 on which the semiconductor chip is to be mounted, and a bonding height L3 at which the semiconductor chip 100 is mounted on the circuit board 300.

To minimize the time required to mount the semiconductor chip 100 on the mounting position on the circuit board 300, the bonding head 500 loaded with the semiconductor chip 100 descends from the preparation height L1 to the search height L2 with a rapidly accelerated motion. The bonding head 500 may also descend to the search height L2 with a motion in combination of rapid acceleration and rapid deceleration.

From the search height L2 to the bonding height L3, the bonding head 500 slowly moves at a constant velocity since it has to search for the mounting position on the circuit board 300. In this process, the bonding head 500 may vibrate. Here, the vibrations of the bonding head 500 may result from various factors. For example, the bonding head 500 may vibrate when the bonding head 500 is not able to move forward since the semiconductor chip 100 touches the circuit board 300. Vibrations of the bonding head 500 may result from a control error of a controller of a flip chip bonding apparatus including the bonding head 500, interference between multiple gantries of the flip chip bonding apparatus when the multiple gantries are used, an up-and-down motion of the descending bonding head 500 itself, and the like.

If the search height L2 is lowered, a time required to descend from the search height L2 to the bonding height L3 can be reduced. However, too low a search height L2 may lead to deterioration of bonding quality. Therefore, the search height L2 may be set higher than an optimum height for searching for the mounting position on the circuit board 300. The search height L2 may be set in view of a sum of a thickness of the semiconductor chip 100 and a thickness of the bumps 150 formed under the semiconductor chip 100.

Although not illustrated in the graph, the bonding head 500 may additionally descend to a position from the bonding height L3. Such an additional descending movement is intended to apply pressure to the semiconductor chip 100 after the semiconductor chip 100 is attached to the circuit board 300, so that the semiconductor chip 100 is effectively mounted on the circuit board 300. When the semiconductor chip 100 is effectively mounted on the circuit board 300, it is placed at the mounting position on the circuit board 300, and thus, is securely electrically connected to the circuit board 300 and is not separated from the mounting position on the circuit board 300. Even if the semiconductor chip 100 touches the circuit board 300 at a position slightly away from the patterns or pads 200 on the circuit board 300, it can still be mounted on the mounting position on the circuit board 100 by applying pressure to the semiconductor chip 100 through the additional descending movement of the bonding head 500.

Once the mounting position on the circuit board 300 is located, a bonding process may be performed. In the bonding process, the semiconductor chip 100 and the circuit board 300 are brought into physical contact with each other, and then, are bonded together by applying a predetermined force and heat or ultrasonic waves. A bonding method used in the bonding process is not limited to the above method.

The bonding height L3 for performing the bonding process is determined by teaching. Teaching is conducted through actual measurement before a mounting apparatus such as the flip chip bonding apparatus including the bonding head 500 is driven. A difference of several to tens of μm may exist between a teaching bonding height and an actual bonding height. Such a difference between the actual bonding height and the teaching bonding height may result from a change in a height of a tip of a bonding tool such as the bonding head 500 due to wear and tear or contamination that occurs while the bonding process is repeated, a height change due to mechanical and electrical hysteresis of a motor of the flip chip bonding apparatus, and a height change due to thermal expansion of parts.

When the teaching bonding height is lower than the actual bonding height, the semiconductor chip 100 is lowered more than necessary, thereby reducing productivity per hour. When the teaching bonding height is higher than the actual bonding height, the semiconductor chip 100 is not lowered by a required distance. Thus, the semiconductor chip 100 may improperly touch the circuit board 300 during the bonding process, resulting in defects, for example, leads may be open. Such defects may deteriorate bonding quality.

Figure 3:
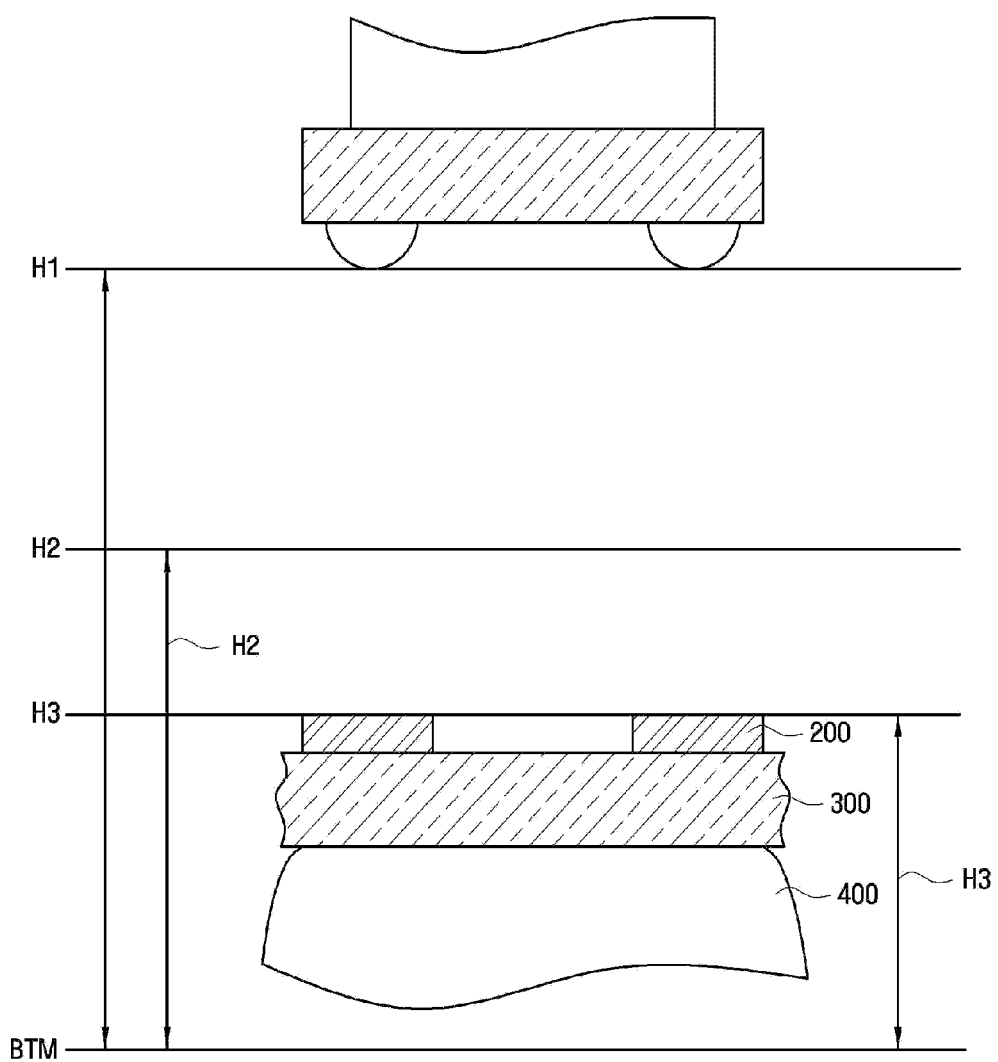
FIG. 3 is a schematic diagram illustrating a flip chip mounting method according to an exemplary embodiment.

FIG. 3 is a schematic diagram illustrating a flip chip mounting method according to an exemplary embodiment. Referring to FIG. 3, flip chip bonding involves a series of operations in which the bonding head 500 moves the semiconductor chip 100 to above the circuit board 300, descends, and then bonds the semiconductor chip 100 to a mounting position on the circuit board 300.

In a preparation operation, the bonding head 500 picks up the semiconductor chip 100 and moves the semiconductor chip 100 to a preparation height H1 above the circuit board 300. The preparation height H1 is measured from the reference height BTM to a bottom surface of the semiconductor chip 100, and corresponds to the preparation height L1 of the bonding head 500 in FIG. 2. The semiconductor chip 100 may be picked up using various methods such as vacuum absorption and a gripper. The bumps 150 are formed on a surface of the semiconductor chip 100, and the patterns or pads 200 corresponding to the bumps 150 of the semiconductor chip 100 are formed on the circuit board 300 placed on a stage 400.

In the preparation operation, positions of the semiconductor chip 100 and the circuit board 300 may be aligned to correspond to each other. For this position alignment, an optical device (not shown) may be inserted between the semiconductor chip 100 and the circuit board 300 to correct position errors using light. After the position alignment, the bonding head 500 performs a series of descending motions along the Y-axis.

In a section (H1-H2) between the preparation height H1 and a search height H2, the semiconductor chip 100 descends at a maximum velocity by making accelerated and/or decelerated movements at least in order to minimize a time required to mount the semiconductor chip 100 on the mounting position on the circuit board 300. The accelerated and/or decelerated movement refers to a control method which uses an acceleration control and/or a deceleration control and which enables a rapid and stable motion. Here, the search height H2 is measured from the reference height BTM to the bottom surface of the semiconductor chip 100, and corresponds to the search height L2 of the bonding head 500 in FIG. 2.

The search height H2 is a height at which the semiconductor chip 100 starts to move slowly. When the semiconductor chip 100 reaches the search height H2, the bonding head 500 starts to search for the mounting position on the circuit board 300. The search height L2 is determined using the sum of the thickness of the semiconductor chip 100 and the thickness of the bumps 150 formed under the semiconductor chip 100. Specifically, the thickness of the semiconductor chip 100 to be mounted and the thickness of the bumps 150 are measured, and then, an appropriate search height is calculated based on the measured thicknesses. The search height H2 is determined in view of an optimum section for searching for the mounting position on the circuit board 300. In a section (H2-H3) between the search height H2 and a bonding height H3, the semiconductor chip 100 moves at a low velocity since the bonding head 500 has to search for the mounting position on the circuit board 300. Here, the bonding height H3 is measured from the reference height BTM to the bottom surface of the semiconductor chip 100, and corresponds to the bonding height L3 of the bonding head 500 in FIG. 2

In a search operation, the bonding head 500 starts to move slowly and search for the mounting position on the circuit board 300 when the semiconductor chip 100 reaches the search height H2. In this process, an up-and-down motion of the descending bonding head 500 itself and the interference between multiple gantries loaded with the bonding head 500 may cause a difference between a command height value and an actual height value of the bonding head 500 and a difference between a command velocity value and an actual velocity value of the bonding head 500. This will be described in detail later.

A bonding operation is performed after the mounting position on the circuit board 300 is located. The semiconductor chip 100 and the circuit board 300 may be bonded together by applying a predetermined force as well as heat and/or ultrasonic waves at the bonding height H3 at which the bumps 150 of the semiconductor chip 100 contact the pads 200.

After the bonding operation, an operation of returning to the preparation operation is performed. This operation is designed to complete a cycle of flip chip bonding process and prepare for a next cycle of flip chip bonding process. To prepare for the next cycle of flip chip bonding process, a complete flip chip package placed on the stage 400 is transferred to a separate site, and a new circuit board 300 is transferred to the stage 400.

Herebelow, movements of the bonding head 500 and the semiconductor chip 100 loaded thereon to locate the mounting position on the circuit board 300 are described using the preparation height L1, the search height L2 and the bonding height L3 of the bonding head 500 assuming that these heights L1, L2 and L3 correspond to the heights H1, H2 and H3 of the semiconductor chip 100, respectively.

Figure 4:
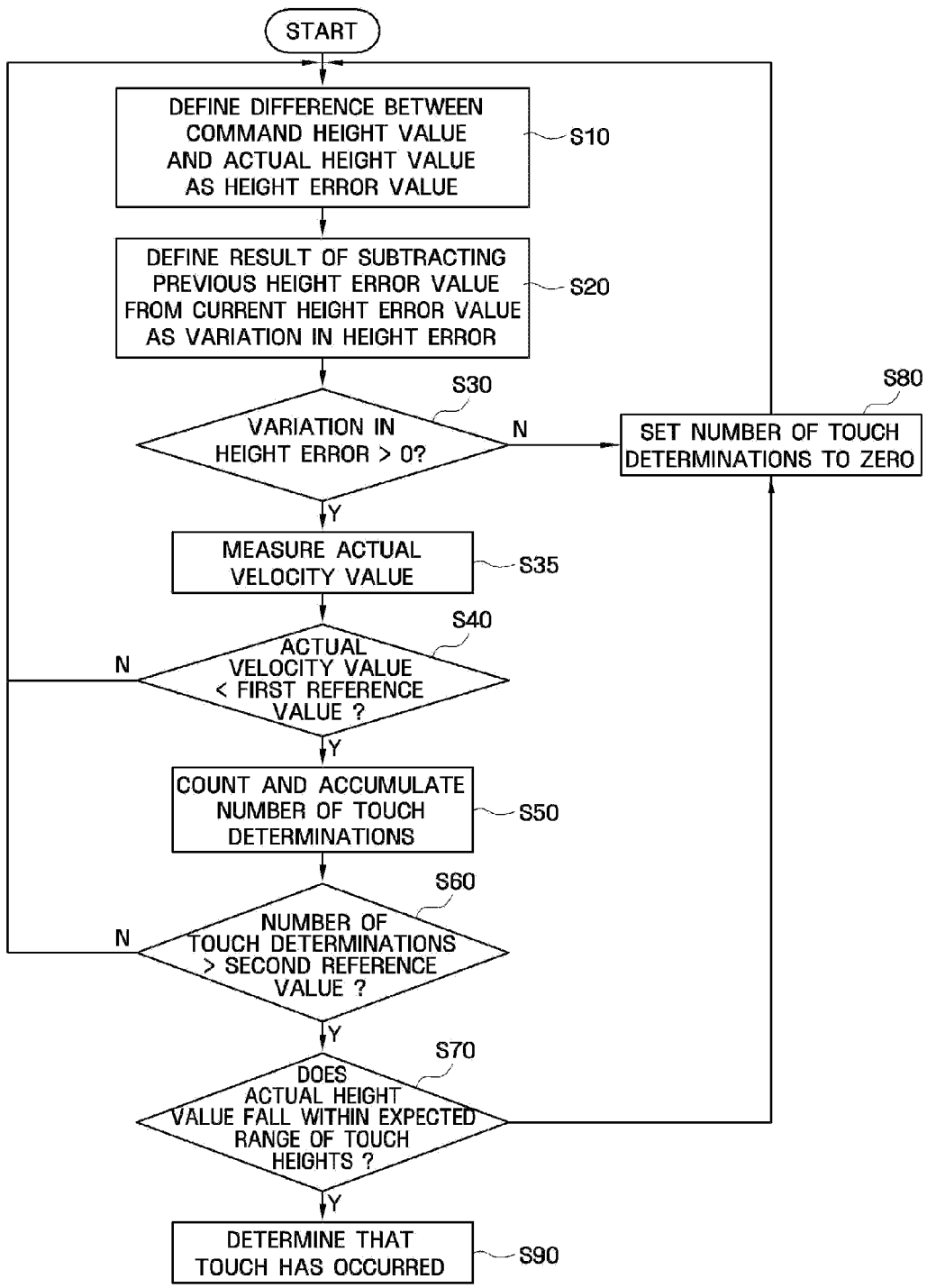
FIG. 4 is a flowchart illustrating a process of locating the mounting position on the circuit board 300 in the flip chip mounting method, according to an exemplary embodiment.

FIG. 4 is a flowchart illustrating a process of locating the mounting position on the circuit board 300 in the flip chip mounting method, according to an exemplary embodiment.

Locating the mounting position on the circuit board 300 may involve identifying vibrations that may occur when the semiconductor chip 100 actually touches the circuit board 300. However, as described above, the bonding head 500 may vibrate not only when the bonding head 500 is not able to further lowered as the semiconductor chip 100 touches the circuit board 300, but also due to a variety of factors such as the control error of the controller of the flip chip bonding apparatus, the interference between multiple gantries of the flip chip bonding apparatus when the multiple gantries are used, and the up-and-down motion of the descending bonding head 500 itself.

Therefore, to find the mounting position on the circuit board 300, vibrations that occur when the semiconductor chip 100 actually touches the circuit board 300 must be distinguished from vibrations resulting from other factors. That is, vibrations resulting from factors such as the control error of the controller, the interference between multiple gantries when the multiple gantries are used, and the up-and-down motion of the descending bonding head 500 itself must be filtered out.

Quantitative data used to distinguish vibrations may include the variation in height error and an actual velocity value. Hereinafter, a process of identifying whether the semiconductor chip 100 has actually touched the circuit board 300 using the variation in height error and the actual velocity value will be described.

Referring to FIG. 4, a difference between a command height value of the bonding head 500 and an actual height value of the bonding head 500 is defined as a height error value (operation S10). The height of the bonding head 500 is compared with a feedback position signal from the motor of the flip chip bonding apparatus. The feedback height signal from the motor is height data and a signal from an encoder. Here, the encoder is a device for detecting an amount of rotation of the motor.

The controller commands the bonding head 500 to descend a predetermined distance per sampling time (measured in μs or ms). A height of the bonding head 500 according to the command is the command height value, and a height of the bonding head 500 resulting from actual movement of the bonding head 500 is the actual height value. The actual height value may be different from the command height value due to vibrations of the descending bonding head 500 itself, the interference between multiple gantries loaded with the bonding head 500, or a touch of the semiconductor chip 100 on the circuit board 300. The difference between the command height value and the actual height value is defined as a height error. That is, (height error)=(command height value)−(actual height value).

A previous height error value obtained at a previous time point is subtracted from a current height error value obtained at a current time point, and a result of the subtraction is defined as a variation in height error (operation S20). Specifically, a result of subtracting a height error value per an $(n-1)^{th}$ sampling time and a height error value per an $n^{th}$ sampling time is defined as a variation in height error. That is, (variation in height error)=(height error value per an $n^{th}$ sampling time)−(height error value per an $(n-1)^{th}$ sampling time).

It is determined whether the variation in height error is greater than zero (operation S30). When the variation in height error is greater than zero, it can be understood that the height error value gradually increases per each sampling time. This indicates that the bonding head 500 has difficulty in descending due to an obstacle (or the circuit board 300) or its own vibrations.

If it is determined that the variation in height error is greater than zero in operation S30, an actual velocity value of the bonding head 500 is measured (operation S35). Next, it is determined whether the actual velocity value of the bonding head 500 is smaller than a first reference value (operation S40). The variation in height error, which is one reference value used to distinguish vibrations, may not be greatly different when the bonding head 500 vibrates since the semiconductor chip 100 actually touches the circuit board 300 from when the bonding head 500 vibrates due to other factors. As a result, it may be difficult to accurately identify the mounting position on the circuit board 300 using the variation in height error. Therefore, another reference value, that is, the actual velocity value, is used.

The variation in actual velocity value resulting from an actual touch of the semiconductor chip 100 on the circuit board 300 may be greater than that resulting from other factors. Therefore, the actual velocity value can be used to determine the position of the circuit board 300.

Figure 6:
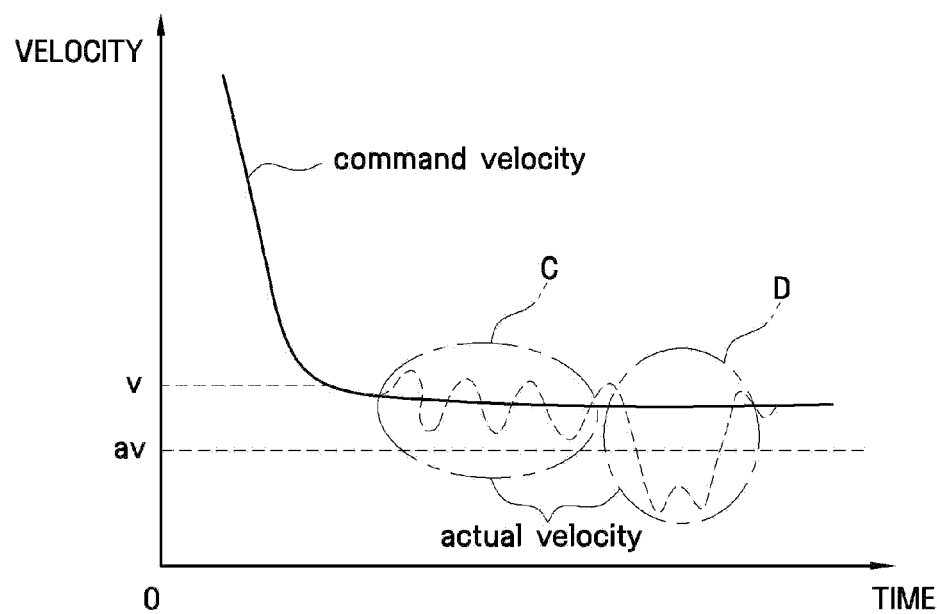
FIG. 6 is a graph illustrating variation in the command velocity of the bonding head 500 and variation in the actual velocity of the bonding head 500, according to an exemplary embodiment.

The first reference value is a $(0<a<1)$ times a command velocity value of the bonding head 500. Referring to FIG. 6, a command velocity becomes constant from the search height. On the other hand, an actual velocity is initially different from the command velocity due to vibrations resulting from, for example, the up-and-down motion of the bonding head 500 itself, and then, follows the command velocity. The actual velocity of the bonding head 500 repeatedly shows this pattern. In an area C of the graph of FIG. 6, the variation in actual velocity is not great. Thus, it can be understood that the difference between the command velocity and the actual velocity in the area C is attributable to vibrations resulting from the control error of the controller, the interference between multiple gantries when the multiple gantries are used, or the up-and-down motion of the descending bonding head 500 itself. On the other hand, the variation in actual velocity is great in an area D. Thus, it can be understood that the difference between the command velocity and the actual velocity in the area D is attributable to vibrations resulting from a touch of the semiconductor chip 100 on the circuit board 300.

When the velocity of the bonding head 500 falls to a value smaller than a predetermined reference value, e.g., an av value, it can be determined that the semiconductor chip 100 has actually touched the circuit board 300. For example, when a=0.6, it can be determined from a velocity of less than 60% of the command velocity that the semiconductor chip 100 has actually touched the circuit board 300. The value of "a" may vary according to a type of flip chip bonding apparatus and circumstances. Through the above process, vibrations resulting not from an actual touch of the semiconductor chip 100 on the circuit board 300, but from the up-and-down motion of the bonding head 500 itself, the interference between gantries, and the control error of the controller can be filtered out.

If the actual velocity value of the bonding head 500 is smaller than the first reference value, the number of touch determinations is counted and accumulated (operation S50). The number of touch determinations as counted and accumulated is compared to a second reference value (operations 60) If the actual velocity value is smaller than the first reference value for five consecutive times, the number of touch determinations is set to five.

The number of touch determinations is a reference value used to determine whether the semiconductor chip 100 has touched the circuit board 300 and does not represent the number of actual touches.

It is determined whether the number of touch determinations is greater than a second reference value (operation S60). The second reference value is a value obtained by measuring actual heights of the bonding head in view of command height values before operation S10 begins. That is, the second reference value refers to the number of successive variations in height error which occur while a semiconductor chip corresponding to the semiconductor chip 100 actually touches the circuit board 300 in a previous chip mounting operations. The number of successive variations in height error, which are expected to occur while the semiconductor chip 100 actually touches the circuit board 300 after the bonding head 500 picks up the semiconductor chip 100 and descends to the circuit board 300, is already calculated. Therefore, when the number of touch determinations is greater than the expected number of variations in height error, it is first assumed that the semiconductor chip 100 has touched the circuit board 300.

It is determined whether the actual height value falls within an expected range of touch heights (operation S70). When the number of touch determinations is greater than the second reference value, it can be presumed that the semiconductor chip 100 has touched the circuit board 300. However, one more process of determining whether the semiconductor chip 100 has touched the circuit board 300 is performed.

Specifically, when the number of touch determinations is greater than the second reference number, the actual height value of the bonding head 500 is obtained using the encoder, and then, it is determined whether the obtained actual height value falls within the expected range of touch heights. The expected range of touch heights is based on a bonding height value calculated by teaching.

When the actual height value falls within the expected range of touch heights, it is determined that the semiconductor chip 100 has touched the circuit board 300 (operation S90). When the actual height value of the bonding head 500 falls within the expected range of touch heights, it is determined that the semiconductor chip 100 has actually touched the circuit board 300.

When the actual height value falls outside the expected range of touch heights, the number of touch determinations is set to zero (operation S80). In this case, it is determined that the number of touch determinations has exceeded the second reference value due to factors other than an actual touch of the semiconductor chip 100 on the circuit board 300. Accordingly, the number of touch determinations is set to zero, and the process of finding the mounting position of the circuit board 300 is performed again from the beginning The above method described in reference to FIG. 4 may be applied from when the bonding head 500 reaches the preparation height L1 or from when the bonding head 500 reaches the search height L2 to when the semiconductor chip 100 actually touches the circuit board 300. Also, determination on whether the semiconductor chip 100 actually touches the circuit board (i.e., S90 in FIG. 4) may be made without performing all operations S30 through S70.

Figure 5:
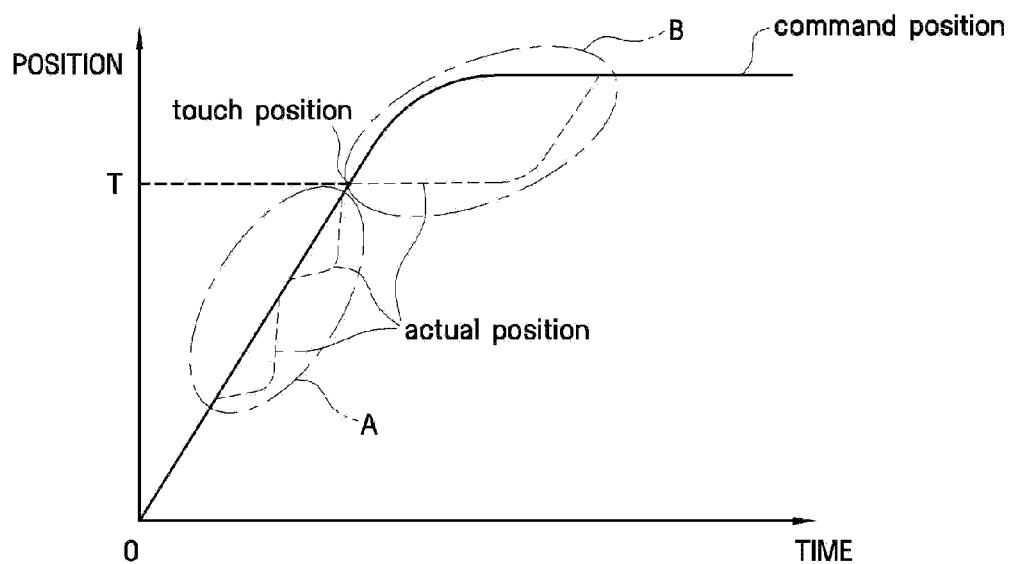
FIG. 5 is a graph illustrating variation in the command height of the bonding head 500 and the variation in the actual height of the bonding head 500, according to an exemplary embodiment.

FIG. 5 is a graph illustrating variation in the command height of the bonding head 500 and the variation in the actual height of the bonding head 500, according to an exemplary embodiment.

Referring to FIG. 5, the X-axis represents time, and the Y-axis represents height. A solid line represents a command height, and a dotted line represents an actual height. A value of the command height continuously increases as an amount of movement per sampling time required by the controller accumulates, and then, becomes constant from a moment when the semiconductor chip 100 touches the circuit board 300. On the other hand, a value of the actual height initially follows the value of the command height, becomes different from the value of the command height due to, e.g., vibrations of the bonding head 500 itself, and then, follows the value of the command height. The value of the actual height repeatedly shows this pattern.

In an area A of the graph, the actual height is different from the command height due to e.g., the vibrations of the bonding head 500 itself. In an area B, the actual height is different from the command height since the semiconductor chip 100 has touched the circuit board 300. That is, the area B is where the semiconductor chip 100 has touched the circuit board 300. Thus, the height of the area B is the height of the circuit board 300. In addition, a height T is a height at which the semiconductor chip 100 has actually touched the circuit board 300.

FIG. 6 is a graph illustrating variation in the command velocity of the bonding head 500 and variation in the actual velocity of the bonding head 500, according to an exemplary embodiment.

Referring to FIG. 6, the X-axis represents time, and the Y-axis represents velocity. A solid line represents a command velocity, and a dotted line represents an actual velocity. The command velocity becomes constant from the search height. On the other hand, the actual velocity is initially different from the command velocity due to, e.g., vibrations of the bonding head 500 itself, and then, follows the command velocity. The actual velocity repeatedly shows this pattern.

In an area C of the graph, the actual velocity is different from the command velocity due to e.g., vibrations of the bonding head 500 itself. In an area D, the actual velocity is different from the command velocity since the semiconductor chip 100 has touched the circuit board 300. That is, the area D is where the semiconductor chip 100 has touched the circuit board 300. As shown in FIG. 6, the variation in velocity is greater when the semiconductor chip 100 has actually touched the circuit board 300 than when the bonding head 500 itself vibrates. When the semiconductor chip 100 actually touches the circuit board 300, the actual velocity of the bonding head 500 may fall to, but not limited to, less than 60% of the command velocity. As described above, the difference between the command velocity value and the actual velocity value may be analyzed to filter out the variations in height error due to vibrations resulting from factors other than an actual touch of the semiconductor chip 100 on the circuit board 300.

Figure 8:
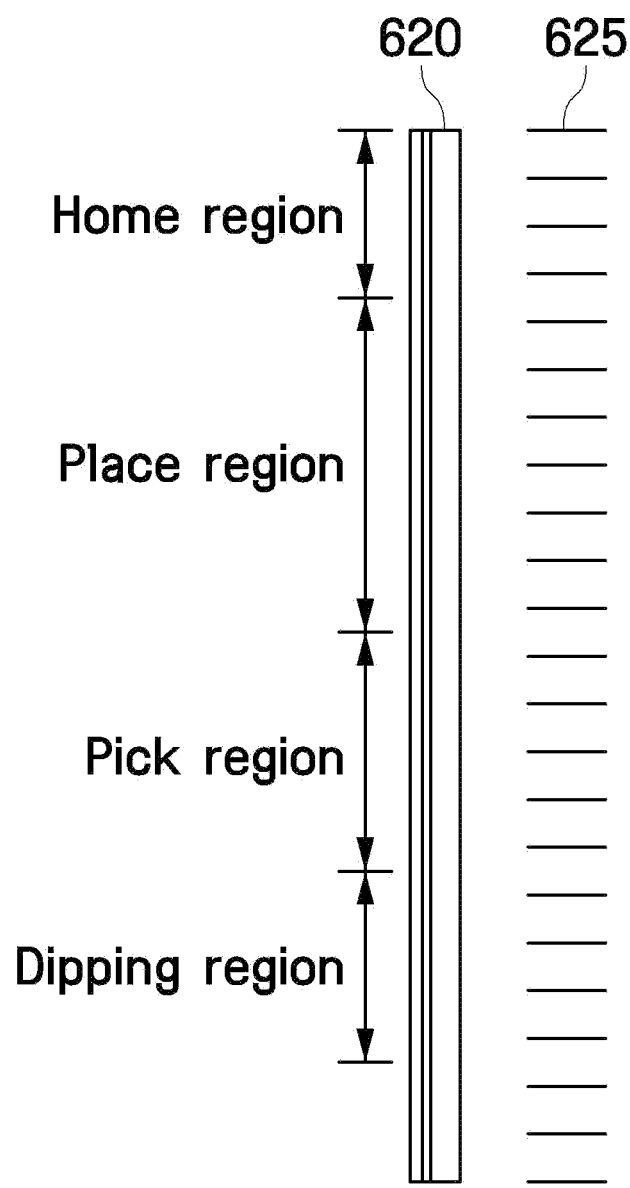
FIG. 8 illustrates a linear scale 625 showing work regions of the bonding head 500, in reference to FIGS. 7A and 7B, according to an exemplary embodiment.

FIG. 7A illustrates a lateral cross-sectional view of a flip chip mounting apparatus 10 in reference to FIGS. 1 and 3, according to an exemplary embodiment. FIG. 7B is a schematic diagram illustrating a case where an up-and-down movement of at least one spindle 505 performing operations applies an impact to the spindle 505 and a linear guide 600, according to an exemplary embodiment. FIG. 8 is a schematic diagram of a linear scale 625 showing work regions of the bonding head 500, according to an exemplary embodiment.

The flip chip mounting apparatus 10 according to the current exemplary embodiment includes the spindle 505, the linear guide 600, a linear motor 700, and a controller 30.

The spindle 505 is installed in a body 20 of the flip chip mounting apparatus 10. The spindle 505 picks up the semiconductor chip 100 and transfers the semiconductor chip 100 to the circuit board 300. The linear guide 600 includes a guide block 610 connected to the spindle 505 and a guide rail 620 guiding a rectilinear motion of the guide block 610. Together with the guide block 610, the linear motor moves the spindle 505 rectilinearly along the guide rail 620. Lastly, the controller 30 moves the spindle 505 to a preparation height above the circuit board 300 and determines a search height. Then, the controller 30 lowers the flip chip mounting apparatus 10 at an accelerated and/or decelerated velocity from the preparation height to the search height by controlling the linear motor 700, lowers the flip chip mounting apparatus 10 at a low velocity from the search height to search for the mounting position on the circuit board 300 by controlling the linear motor 700, and controls the flip chip bonding apparatus 10 to perform a bonding process at the mounting position on the circuit board 300.

The flip chip mounting apparatus 10 tests the spindle 505 to identify whether the spindle 505 is defective. The bonding head 500 may include at least one spindle 500. Thus, each of the spindles 505 may be tested individually to identify whether any of the individual spindles 505 is defective.

While moving up and down along the linear guide 600, the spindle 505 performs picking-up, dipping, inspecting, and placing operations.

The spindle 505 moves up and down when supplied with power from the linear motor 700 which includes a coil 710 and a magnetic substance 720. In addition, the spindle 505 may be connected to the guide rail 620 by the guide block 610.

A groove (not shown) may be formed in the guide rail 620, and a plurality of balls may be placed in the groove. Accordingly, the spindle 505 may perform a number of operations while moving up and down along the linear guide 600. While the spindle 505 performs operations, an impact may be repeatedly applied to a coupling 510 which is a connection point between the spindle 505 and a nozzle 520 or a connection point between the spindle 505 and the guide block 610/ the guide rail 620.

Under such repeated impact, tools such as the spindle 505 and the linear guide 600 are damaged, thereby reducing precision of the flip chip mounting apparatus 10.

While a tolerance of 30 to 50 µm is required of a general chip mounter, a higher tolerance of 8 to 10 µm is required of the flip chip mounting apparatus 10. Therefore, damage to the components of the flip chip mounting apparatus 10 by continuous and repeated operations reduces precision of a flip chip mounting operation, thus increasing probability of defective products.

While the spindle 505 continuously performs operations through its up-and-down movement, it may continuously impact on the components including the spindle 505 and the linear guide 600.

For example, a top surface of a container 450 which holds flux to be applied to the bumps 150 of the semiconductor chip 100 may slope such that both ends thereof are at different heights as shown in FIG. 7A. In this case, a greater impact is applied to the spindle 505, the linear guide 600 which supports the movement of the spindle 505, and a connection point between the spindle 505 and the linear guide 600 in the process of picking up the semiconductor chip 100, dipping in the container containing flux and mounting the semiconductor chip 100 on the circuit board 300.

Accordingly, some of the balls in the linear guide 600 may be damaged, or the surface of the groove of the linear guide 600 may become rough. Consequently, this may affect precision of a subsequent operation.

To prevent such impact, as described above, the controller moves the spindle 505 to the preparation height L1 above the circuit board 300, determines the search height L2, lowers the flip chip mounting apparatus 10 at an accelerated and/or decelerated velocity from the preparation height L1 to the search height L2 by controlling the linear motor, lowers the flip chip mounting apparatus 10 at a low velocity from the search height L2 to search for the mounting position on the circuit board 300 by controlling the linear motor 700, and controls the flip chip bonding apparatus 10 to perform a bonding process at the located mounting position on the circuit board 300.

Specifically, the controller 30 includes a unit for defining a difference between a command height value of the spindle 505 and an actual height value of the spindle 505 as a height error value, a unit for defining a result of subtracting a previous height error value from a current height error value as a variation in height error, a unit for determining whether the variation in height error is greater than zero, a unit for determining whether an actual velocity value of the spindle 505 is smaller than a first reference value, a unit for accumulating the number of touch determinations when the actual velocity value of the spindle 505 is smaller than the first reference value, a unit for determining whether the accumulated number of touch determinations is greater than a second reference value, and a unit for determining whether the actual height value of the spindle 505 falls within a preset expected range of touch positions when the accumulated number of touch determinations is greater than the second reference value. Using these units, the controller can perform height control of the spindle 505 with precision.

To detect the height of the spindle 505 more accurately, the flip chip mounting apparatus 10 may further include the linear scale 625. The linear scale 625 may be installed on the guide rail 620 or in the guide rail 620 to accurately detect the height of the spindle 505. In FIG. 8, the linear scale 625 is illustrated.

The linear scale 625 may include a sensor 627 which is installed at an end of the guide rail 620 to detect the height of the guide block 610 and transmit information about the detected height of the guide block 610 to the controller. Since the sensor 627 detects the height of the guide block 610, the height of the spindle 505 which moves in accordance with the guide block 610 can also be detected accurately.

The linear motor 700 includes the magnetic substance 710 and the coil 720. An interaction of magnetic fluxes generated between the coil 720 and the magnetic substance 710 when power is supplied to the coil 720 produces a force that causes the magnetic substance 710 and the coil 720 to be displaced relative to each other along a predetermined movement direction in a straight line. This force enables the linear motor 700 to move the spindle 505 rectilinearly along the guide rail 620, together with the guide block 610.

The positions of the magnetic substance 710 and the coil 720 in FIGS. 7A and 7B may be reversed. That is, the coil 720 may be located where the magnetic substance 710 is illustrated in FIGS. 7A and 7B, and the magnetic substance 710 may be located where the coil 720 is illustrated in FIGS. 7A and 7B. In FIGS. 7A and 7B, the coil 720 serves as a moving driving part, and the magnetic substance 710 serves as a stationary part that guides the movement of the coil 720. However, if the positions of the coil 720 and the magnetic substance 710 are reversed, their roles may also be reversed.

When a current is made to flow through the coil 720, magnetic flux is generated around the coil 720. The generated magnetic flux interacts with magnetic flux generated by the magnetic substance 710, thus producing thrust. The thrust is a force that pushes an object in its direction of motion. The magnitude of the thrust is proportional to a multiplication of current and magnetic flux.

To use the linear motor 700 as a servo device, a device for detecting height and velocity is needed. Thus, the flip chip mounting apparatus 10 may further include an encoder which detects the velocity of the linear motor or the positions of the magnetic substance 710 and the coil 720. Hence, the amount of rotation of the linear motor can be detected using the encoder.

As described above, the spindle 505 in the flip chip mounting apparatus 10 repeatedly moves up and down to pick up, dip, inspect, and place a part on the circuit board 300. Generally, these operations are not performed at the same height.

In FIG. 8, a work region corresponding to each height of the spindle 505 is illustrated. To pick up the semiconductor chip 100, the spindle 505 descends to a height at which the semiconductor chip 100 is located and then ascends. In this process, an impact may be applied to tools including the spindle 505. A dipping operation is an operation of dipping the picked-up semiconductor chip 100 in flux. The container 450 that contains flux is made of a hard metal material, and a bottom surface thereof is generally not flat. Therefore, in the process of picking up and dipping the semiconductor chip 100, the spindle 505 may collide with the bottom surface of the container 450, thus applying an impact to the spindle 505 or the linear guide 600. In addition, the circuit board 300 is supported by a stage 400 thereunder, and the stage 400 sucks in air so that the circuit board 300 can be closely attached to a top surface of the stage 400 to be parallel to the top surface of the stage 400. In this state, the spindle 505 mounts the semiconductor chip 100 on the circuit board 300. Here, if the stage 400 and the circuit board 300 are not parallel to the semiconductor chip 100 picked up by the spindle 505, an impact may also be applied to the spindle 505. Even if the stage 400 and the circuit board 300 are parallel to the semiconductor chip 100, the spindle 505 may be damaged by the impact of continuous and repeated operations.

The semiconductor chip 100 picked up by the spindle 505 touches the stage 400 or the container 450 which contains flux at different heights. Accordingly, positions at which an impact is applied to the spindle 505 belong to different sections. Therefore, as described above, the spindle 505 of the flip chip mounting apparatus 10 according to the exemplary embodiments descends at an accelerated and/or decelerated velocity from the preparation height L1 to the search height L2 by precisely controlling the linear motor, which changes the height of the spindle 505, using the controller 30, descends at a low velocity from the search height L2 to search for the mounting position on the circuit board 300 by controlling the linear motor 700 using the controller 30, and performs a bonding process at the located mounting position on the circuit board 300.

In concluding the detailed description, those skilled in the art will appreciate that many variations and modifications can be made to the exemplary embodiments without substantially departing from the principles of the inventive concept. Therefore, the disclosed exemplary embodiments of the invention are used in a generic and descriptive sense only and not for purposes of limitation. For example, the inventive concept may be applied not only to the flip chip mounting method involving the semiconductor chip 100 and the circuit board 300 as described in the exemplary embodiments but also to other device mounting methods involving other types of device and board.

What is claimed is:

1. A device mounting method comprising:
    placing a bonding head, on which a device is loaded, at a preparation height above a board;
    determining a search height at which a mounting position on the board, on which the device is to be mounted, is searched for; and
    lowering the bonding head from the preparation height to a bonding height via the search height, and mounting the device on the mounting position on the board,
    wherein the lowering and mounting comprises determining whether the device touches the board by performing at least one of following operations:
        (a) obtaining a command height of the bonding head input by a controller of the bonding head and an actual height of the bonding head at two successive time points, obtaining a difference between the command height and the actual height at the two successive time points, and determining whether a first condition is satisfied, the first condition being that the difference at a later time point is greater than the difference at an earlier time point;
        (b) obtaining an actual velocity of the bonding head, comparing the actual velocity with a first reference value, and determining whether a second condition is satisfied, the second condition being that the actual velocity is lower than the first reference value; and
        (c) obtaining the actual height of the bonding head, comparing the actual height with a predetermined range of heights of the bonding head, and determining whether a third condition is satisfied, the third condition being that the actual height is within the predetermined range,
    wherein the method further comprises determining that the device touches the board if at least one of the first, second and third conditions is satisfied,
    wherein the difference between the command height and the actual height at each of the two successive time points comprises a height error, and
    wherein the obtaining the difference comprises:
        obtaining a height error for the each of the two successive time points; and
        calculating a variation in height error by subtracting a previous height error from a current height error.

2. The method of claim 1, wherein if the first condition is not satisfied, operation (a) is repeatedly performed,
    wherein if the second condition is not satisfied, operation (b) is repeatedly performed, and wherein if the third condition is not satisfied, operation (c) is repeatedly performed.

3. The method of claim 1, wherein the lowering and mounting comprises determining whether the device touches the board by performing two or three of operations (a), (b) and (c), and
wherein the method further comprises determining that the device touches the board if two or three conditions in the two or three of the operations, respectively, are satisfied.

4. The method of claim 1, wherein the lowering and mounting comprises determining whether the device touches the board by performing all of operations (a), (b) and (c),
wherein operations (a), (b) and (c) are performed in this order; and
wherein the method further comprises determining that the device touches the board if the first, second and third conditions are satisfied in this order.

5. The method of claim 1, wherein the lowering and mounting comprises determining whether the device touches the board by performing at least operations (a), (b) and operation (b-1),
wherein operation (b-1) comprises determining that touch determination occurs if the second condition is satisfied, counting a number of occurrence of the touch determination, comparing the number of occurrence of the touch determination with a second reference value, and determining whether a fourth condition is satisfied, the fourth condition being that the number of occurrence of the touch determinations is greater than the second reference value,
wherein the method further comprises determining that the device touches the board, if the first, second and fourth conditions are satisfied in this order, and
wherein if the fourth condition is not satisfied, operations (a), (b) and (b-1) are repeatedly performed in this order.

6. The method of claim 5, wherein the second reference value is a number of successive variations between a command height of the bonding head input by the controller and an actual height of the bonding head which is measured while another device, corresponding to the device, loaded on the bonding head touches the board before the bonding head is loaded with the device and placed at the preparation height.

7. The method of claim 5, wherein the lowering and mounting comprises all of operations (a), (b), (b-1) and (c),
wherein it is determined that the device touches the board, if the first, second, fourth and third conditions are satisfied in this order, and
wherein if third condition is not satisfied, the number of occurrence of the touch determinations is set to zero and operations (a), (b), (b-1) and (c) are repeatedly performed in this order.

8. The method of claim 1, wherein, in operation (b), the first reference value is a times a predetermined command velocity of the bonding head input by the controller, where $0<a<1$.

9. The method of claim 1, wherein the device is a semiconductor chip, and the board is a circuit board.

10. The method of claim 1, wherein the bonding head is lowered from the preparation height to the bonding height in a motion in combination of acceleration and deceleration.

* * * * *